(12) United States Patent
Deak et al.

(10) Patent No.: US 10,690,515 B2
(45) Date of Patent: Jun. 23, 2020

(54) DUAL Z-AXIS MAGNETORESISTIVE ANGLE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co. Ltd., Zhangjiagang (CN)

( * ) Notice: Subject to any disclaimer, the term of this patent is extended or adjusted under 35 U.S.C. 154(b) by 0 days.

(21) Appl. No.: 15/504,981

(22) PCT Filed: Aug. 17, 2015

(86) PCT No.: PCT/CN2015/087215
§ 371 (c)(1),
(2) Date: Feb. 17, 2017

(87) PCT Pub. No.: WO2016/026412
PCT Pub. Date: Feb. 25, 2016

(65) Prior Publication Data
US 2017/0356764 A1 Dec. 14, 2017

(30) Foreign Application Priority Data
Aug. 18, 2014 (CN) .......................... 2014 1 0406142

(51) Int. Cl.
*G01D 5/16* (2006.01)
*G01R 33/09* (2006.01)
*G01B 7/30* (2006.01)

(52) U.S. Cl.
CPC ................. *G01D 5/16* (2013.01); *G01B 7/30* (2013.01); *G01R 33/09* (2013.01)

(58) Field of Classification Search
CPC ........ G01D 5/16; G01D 5/145; G01R 33/093; G01R 33/0011
See application file for complete search history.

(56) References Cited

U.S. PATENT DOCUMENTS

| 9,442,168 B2* | 9/2016 | Paci ..................... B82Y 25/00 |
| 2005/0253578 A1* | 11/2005 | Kawashima .......... G01D 5/145 324/207.25 |

(Continued)

FOREIGN PATENT DOCUMENTS

| CN | 101629802 | 1/2010 |
| CN | 101918796 | 12/2010 |

(Continued)

OTHER PUBLICATIONS

"International Application No. PCT/CN2015/087215, International Search Report and Written Opinion dated Oct. 28, 2015", (Oct. 28, 2015), 10 pgs.

*Primary Examiner* — Akm Zakaria
(74) *Attorney, Agent, or Firm* — Schwegman Lundberg & Woessner, P.A.

(57) ABSTRACT

A dual Z-axis magnetoresistive angle sensor comprising a circular permanent magnet encoding disc, two Z-axis magnetoresistive sensor chips, and a PCB, two Z-axis magnetoresistive sensors are placed on the PCB. The magnetic sensing directions of the Z-axis magnetoresistive sensors are orthogonal to the substrate. Each Z-axis magnetoresistive sensor chip comprises a substrate and at least one magnetoresistive sensor located on the substrate. The magnetic field sensitive direction of the magnetoresistive sensor is perpendicular to the substrate. The magnetoresistive sensor comprises a flux concentrator and a magnetoresistive sensor unit. The magnetoresistive sensor unit is connected electrically into a push-pull structure. The push arm and pull arm of the magnetoresistive sensor are respectively located at two side positions equidistant from Y-axis central line and above or below the flux concentrator. The circular permanent magnet encoding disc has a magnetization direction parallel to the diameter direction. When the circular permanent encoding disc rotates, a magnetic field measurement (Continued)

angle is calculated via orthogonal magnetic fields measured by the two z-axis magnetoresistive sensor chip. The magnetic field measurement angle can be used for representing a rotation angle of the circular permanent magnetic encoding disc. This dual Z-axis magnetoresistive angle sensor's structure is simple, and it also has the characteristics of high sensitivity and high spatial flexibility.

14 Claims, 6 Drawing Sheets

(56) References Cited

U.S. PATENT DOCUMENTS

| | | | |
|---|---|---|---|
| 2008/0231266 A1* | 9/2008 | Hayashi | G01D 5/145 |
| | | | 324/207.25 |
| 2014/0225605 A1* | 8/2014 | Lei | G01R 33/093 |
| | | | 324/252 |

FOREIGN PATENT DOCUMENTS

| | | |
|---|---|---|
| CN | 103901363 | 7/2014 |
| CN | 104197827 | 12/2014 |
| CN | 204043603 | 12/2014 |
| JP | 2003075108 | 3/2003 |
| WO | WO-2016026412 | 2/2016 |

* cited by examiner

DUAL Z-AXIS MAGNETORESISTIVE ANGLE SENSOR

PRIORITY CLAIM TO RELATED APPLICATIONS

This application is a U.S. national stage application filed under 35 U.S.C. § 371 from International Application Serial No. PCT/CN2015/087215, which was filed 17 Aug. 2015, and published as WO2016/026412 on 25 Feb. 2016, and which claims priority to Chinese Application No. 201410406142.8, filed 18 Aug. 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a dual Z-axis magnetoresistive angle sensor.

BACKGROUND ART

A magnetoresistive angle sensor consisting of a magnetoresistive sensor and a permanent magnet encoding disc may be applied to fields such as magnetic encoders and rotational position sensors, and in general cases, planar X-Y type magnetoresistive angle sensor chips are used for magnetoresistive sensors such as TMR and GMR. Measurement of a rotation angle of the permanent magnet encoding disc is implemented by measuring X-direction and Y-direction magnetic-field components on a same chip and calculating an angle between the X-direction magnetic-field component and the Y-direction magnetic-field component. However, it mainly has the following problems:

1) When the X-Y type magnetoresistive angle sensor chip measures an angular position together with a circular permanent magnet encoding disc, a measurement plane of the chip is located above a position parallel to a rotation plane region of the circular permanent magnet encoding disc, and a sensitive magnetic field measured by the chip comes from a magnetic field of the circular permanent magnet encoding disc distributed above the rotation plane region of the circular permanent magnet encoding disc; therefore, a mounting space and a magnetic field homogeneous region of the X-Y magnetoresistive angle sensor chip are limited, and spatial flexibility is poor.

2) The distribution of a rotating magnetic field, above the rotation plane, of the circular permanent magnet encoding disc of the X-Y type magnetoresistive angle sensor chip is easily interfered by a nearby magnet such as a soft magnetic material or a permanent magnet; as a result, an angle measurement region is changed, a correct measurement angle cannot be obtained, and the stability is poor.

SUMMARY OF THE INVENTION

In view of the foregoing problems, the present invention provides a dual Z-axis magnetoresistive angle sensor, to replace the X-Y magnetoresistive angle sensor; a radial rotating magnetic field generated at the outer edge of a circular permanent magnet encoding disc is measured to replace a rotating magnetic field located above a rotation plane of the circular permanent magnet encoding disc, and two discrete Z-axis magnetoresistive sensor chips with a phase difference of 90 degrees are used to replace a single X-Y magnetoresistive sensor chip. As the two Z-axis magnetoresistive sensor chips are located at the outer edge of the circular permanent magnet encoding disc, the spatial mounting flexibility thereof is significantly improved.

A dual Z-axis magnetoresistive angle sensor provided in the present invention includes a circular permanent magnet encoding disc, two Z-axis magnetoresistive sensor chips, and a PCB; the circular permanent magnet encoding disc is attached to a rotating shaft, and the rotating shaft rotates around a central axis of the circular permanent magnet encoding disc; the two Z-axis magnetoresistive sensor chips each include a substrate and at least one Z-axis magnetoresistive sensor located on the substrate, and a magnetic field sensitive direction of the Z-axis magnetoresistive sensor is perpendicular to a plane where the substrate is located; the two Z-axis magnetoresistive sensor chips are located on the PCB, magnetic field sensitive directions of the two Z-axis magnetoresistive sensor chips as well as the central axis of the circular permanent magnet encoding disc are orthogonal to one another, and the two Z-axis magnetoresistive sensor chips maintain an equal distance r+Det from the central axis of the circular permanent magnet encoding disc, where r is a radius of the circular permanent magnet encoding disc, and Det>0; when the circular permanent magnet encoding disc rotates, the two Z-axis magnetoresistive sensor chips separately convert two orthogonal magnetic field signals generated by the circular permanent magnet encoding disc into two voltage signals for output, thereby calculating, according to the two voltage signals, a rotation angle ranging from 0-360 degrees of the circular permanent magnet encoding disc.

Preferably, a magnetization direction of the circular permanent magnet encoding disc is parallel to the diameter direction.

Preferably, the Det distance is 0-2 r.

Preferably, the Z-axis magnetoresistive sensor includes magnetoresistive sensor units and a flux concentrator, the flux concentrator is elongated with a major axis parallel to a Y-axis direction and a minor axis parallel to an X-axis direction, the magnetoresistive sensor units have sensitive directions parallel to the X-axis direction, and are electrically connected into a magnetoresistive bridge including at least two bridge arms, where each of the bridge arms is a two-port structure formed by electrically connecting one or more magnetoresistive sensor units, the magnetoresistive sensor units in the bridge arms are arranged into multiple magnetoresistive columns along a direction parallel to the Y-axis direction, and the magnetoresistive bridge is a push-pull bridge, the push arm and the pull arm being respectively located at different sides of a Y-axis central line above or below the flux concentrator and being equidistant from the corresponding Y-axis central line.

Preferably, the flux concentrator is a soft magnetic alloy material including one or more elements of Ni, Fe, and Co.

Preferably, the magnetoresistive sensor unit is a GMR or TMR magnetoresistive sensor unit.

Preferably, the Z-axis magnetoresistive sensor includes N+2 (N is an integer greater than 0) flux concentrators, and the magnetoresistive columns correspond to N flux concentrators in the middle.

Preferably, the Z-axis magnetoresistive sensor includes one flux concentrator, and the magnetoresistive columns correspond to the one flux concentrator.

Preferably, the Z-axis magnetoresistive sensor includes 2 flux concentrators, and the magnetoresistive columns respectively correspond to positions at different sides of Y-axis central lines of the 2 flux concentrators, and are equidistant from the Y-axis central lines of the corresponding flux concentrators.

Preferably, a space S between two adjacent flux concentrators in the Z-axis magnetoresistive sensor is not less than a width Lx of the flux concentrator.

Preferably, a space S between two adjacent flux concentrators in the Z-axis magnetoresistive sensor is greater than 2 Lx, Lx being a width of the flux concentrator.

Preferably, as a space between the magnetoresistive unit columns of the Z-axis magnetoresistive sensor and an upper edge or a lower edge of the flux concentrator decreases, or a thickness Lz of the flux concentrator increases, or a width Lx of the flux concentrator decreases, sensitivity of the z-axis magnetoresistive sensor increases.

Preferably, the push-pull bridge of the Z-axis magnetoresistive sensor is one of a half bridge structure, a full bridge structure, or a quasi-bridge structure.

Preferably, the two Z-axis magnetoresistive sensors have the same magnetic field sensitivity.

DETAILED DESCRIPTION

The present invention is described below in detail with reference to the accompanying drawings and in combination with embodiments.

Embodiment 1

Figure 1:
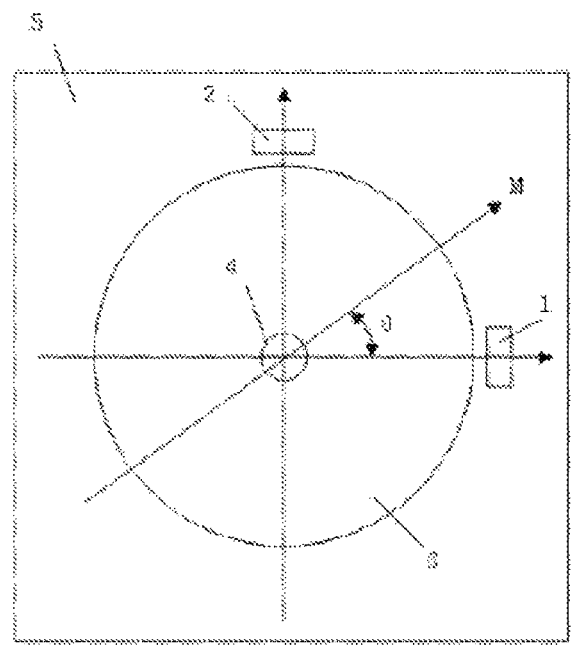
FIG. 1 is a front view of a dual Z-axis magnetoresistive rotation angle sensor.
Figure 2:
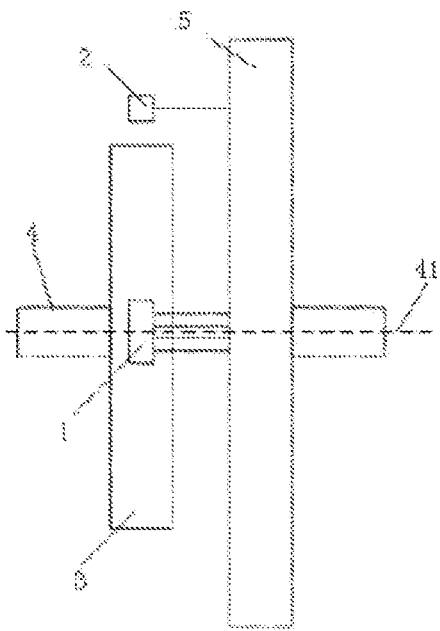
FIG. 2 is a side view of the dual Z-axis magnetoresistive rotation angle sensor.

FIG. 1 and FIG. 2 are respectively a front view and a side view of a dual Z-axis magnetoresistive rotation angle sensor, and it can be seen that, the dual Z-axis magnetoresistive rotation angle sensor includes two Z-axis magnetoresistive sensor chips 1 and 2 disposed on a PCB 5, and a circular permanent magnet encoding disc 3, where the circular permanent magnet encoding disc 3 is attached to a rotating shaft 4, the rotating shaft 4 rotates around a central axis 41 of the circular permanent magnet encoding disc 3, magnetic field sensitive directions of the two Z-axis magnetoresistive sensor chips 1 and 2 are orthogonal, and the two Z-axis magnetoresistive sensor chips 1 and 2 are separately located at an outer side of a rotation plane of the circular permanent magnet encoding disc 3. A central normal of the chip passes through the center of the circular permanent magnet encoding disc 3, and a magnetization direction M of the circular permanent magnet encoding disc 3 is parallel to a direction of a straight line passing through the diameter, the two Z-axis magnetoresistive sensor chips are at an equal distance, which is r+Det, from the central axis 41 of the circular permanent magnet encoding disc 3, where r is a radius of the circular permanent magnet encoding disc, and Det is greater than 0.

Embodiment 2

Figure 3:
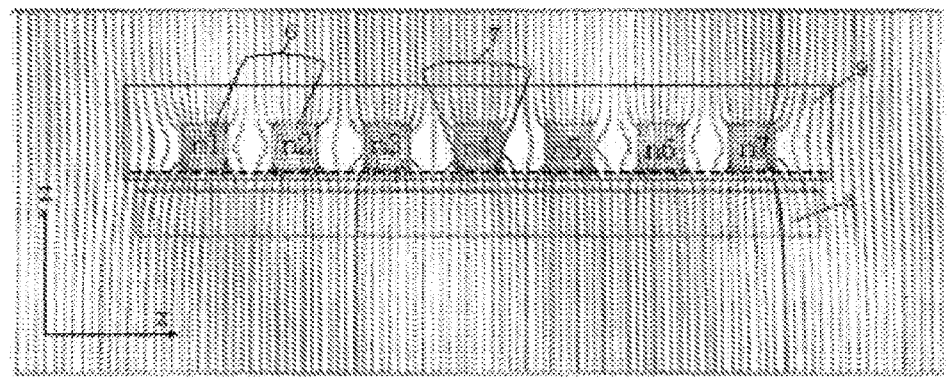
FIG. 3 is a first structural diagram of a Z-axis magnetoresistive sensor.

FIG. 3 shows a Z-axis magnetoresistive sensor chip and a schematic diagram of measurement of a Z-direction magnetic field thereof, and the Z-axis magnetoresistive sensor chip includes a substrate 8, and at least one Z-axis magnetoresistive sensor 9 on the substrate 8. The Z-axis magnetoresistive sensor 9 includes a flux concentrator 6 and magnetoresistive unit columns 7 which are located above or below the flux concentrator 6 and equidistant from a Y-axis central line of the flux concentrator. The principle thereof is that when a Z-direction external magnetic field passes through the flux concentrator 6, the magnetic field is distorted above or below the flux concentrator 6 because the flux concentrator 6 is a high-permeability soft magnetic alloy material, for example, a soft magnetic alloy including one or more elements of Co, Fe, Ni, and the like; a magnetic-field component in an X-axis direction appears and is directly proportional to the Z-direction magnetic field, and thus can be detected by the magnetoresistive unit columns 7 located at two sides of the Y-axis central line above or below the flux concentrator 6. Magnetic field sensitive directions of the magnetoresistive sensor units are the X direction, and the magnetoresistive sensor unit is a TMR or GMR sensor unit; the flux concentrator is elongated with its length in the Y direction and width in the X direction, and the multiple flux concentrators are arranged in parallel along the X direction at equal intervals.

Figure 4:
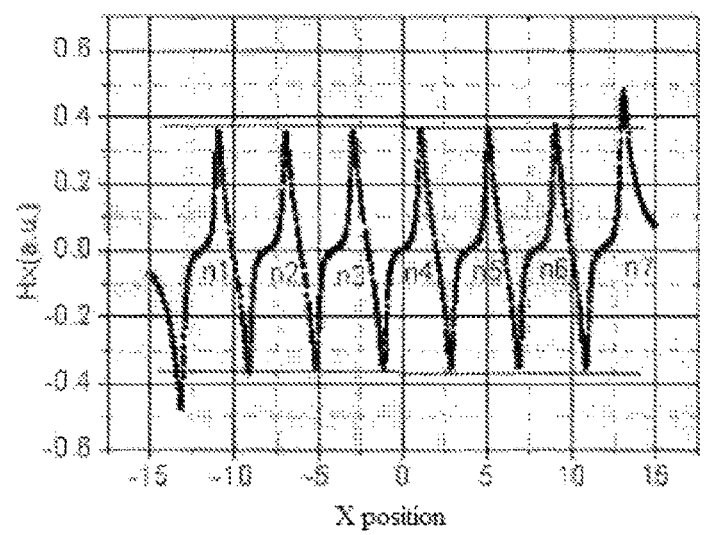
FIG. 4 is a second structural diagram of the Z-axis magnetoresistive sensor.

For ease of description, FIG. 3 lists multiple flux concentrators numbered n1 to n7, and FIG. 4 shows distribution of X-component magnetic fields at positions of the magnetoresistive sensor units that are above or below the multiple flux concentrators 6 numbered n1 to n7, and are located at two sides equidistant from the Y-axis central lines of the flux concentrators 6. As can be seen, magnetoresistive sensor units at two sides of a Y-axis central line sense X-component magnetic fields of opposite directions, where one is positive and the other is negative; however, two flux concentrators at two sides of the Y-axis central line each correspond to opposite X-component magnetic fields of different amplitudes, where an outer X-direction magnetic-field component is obviously greater than an inner X-direction magnetic-field component. Except the flux concentrators at two sides, flux concentrators in the middle each correspond to same-amplitude X-direction magnetic-field components at two positions.

A space S between the two adjacent flux concentrators in the Z-axis magnetoresistive sensor is not less than a width Lx of the flux concentrator. In to another embodiment, a space S between the two adjacent flux concentrators in the Z-axis magnetoresistive sensor is greater than 2 Lx.

In addition, by reducing a space between the magnetoresistive unit columns of the Z-axis magnetoresistive sensor and an upper edge or a lower edge of the flux concentrator, or increasing a thickness Lz of the flux concentrator, or decreasing a width Lx of the flux concentrator, sensitivity of the z-axis magnetoresistive sensor can be increased.

Embodiment 3

According to the distribution feature of the X-direction magnetic-field component of the magnetoresistive sensor units at positions above or below the flux concentrators, it can be seen that, the Z-axis magnetoresistive sensor may have the following structure features: the magnetoresistive sensor units are electrically connected into a push-pull full bridge, half bridge or quasi-bridge structure, each bridge arm includes one or more magnetoresistive sensor units which are electrically connected into a two-port structure, and the magnetoresistive unit are arranged into magnetoresistive unit columns, the push arm and the pull arm being respectively located at different sides of the Y-axis central line above or below the flux concentrator and being equidistant from the Y-axis central line of the corresponding flux concentrator.

Figure 5:
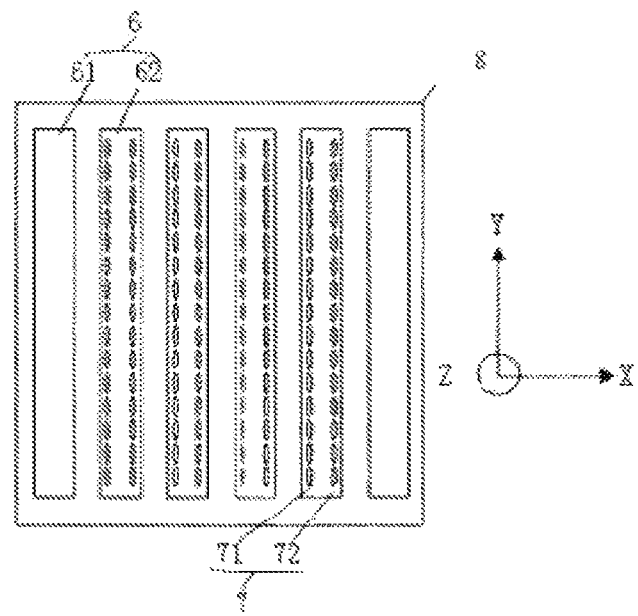
FIG. 5 is a third structural diagram of the Z-axis magnetoresistive sensor.

According to different distribution features and quantities of magnetoresistive unit columns in the flux concentrator, the Z-axis magnetoresistive sensor may be classified into several structures as follows:

FIG. 5 is a first structural diagram of the Z-axis magnetoresistive sensor located on the substrate 8, where the Z-axis magnetoresistive sensor includes N+2 (N is an integer greater than 1) flux concentrators 6, including N flux concentrators 62 in the middle and 2 flux concentrators 61 at two sides; 71 and 72 among the magnetoresistive sensor unit columns 7 are distributed at positions at two sides of Y-axis central line corresponding to the N flux concentrators 62 in the middle, because X-direction magnetic-field components at positions of the magnetoresistive sensor unit columns 71 and 72 at two sides of the Y-axis central line corresponding to the N flux concentrators 62 in the middle are the same in magnitude and opposite in direction, thus forming a push-pull bridge structure.

Figure 6:
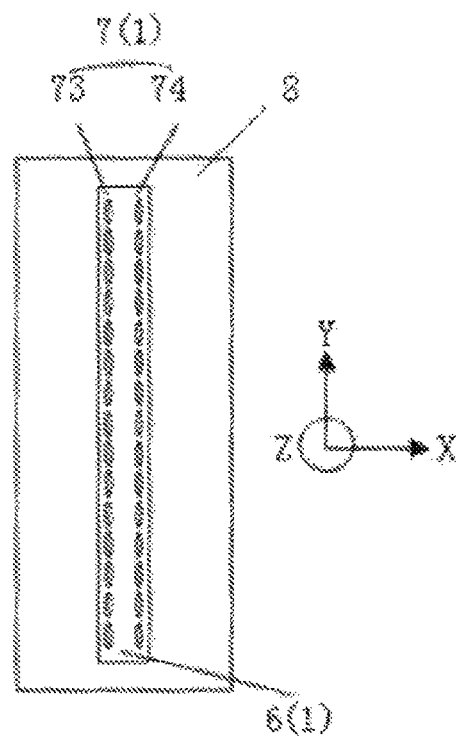
FIG. 6 is a schematic diagram of measurement of a Z-direction magnetic field of the Z-axis magnetoresistive sensor.

FIG. 6 is a second structural diagram of the Z-axis magnetoresistive sensor located on the substrate 8, where the Z-axis magnetoresistive sensor includes only one flux concentrator 6(1), and a magnetoresistive unit column 7(1) includes two magnetoresistive sensor unit columns 73 and 74 which are distributed at two side positions of the Y-axis central line of the flux concentrator, because when there is one flux concentrator, X-direction magnetic-field components at the foregoing two positions obviously have the feature of being the same in magnitude and opposite in direction, thus forming a push-pull bridge structure.

Figure 7:
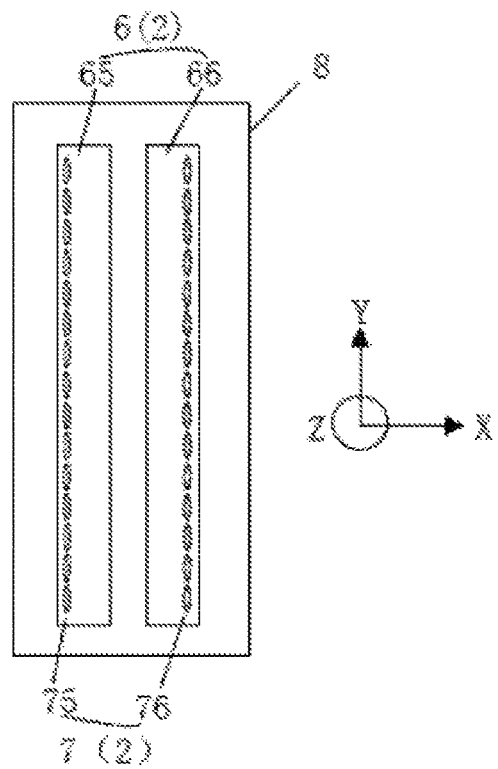
FIG. 7 is a diagram of distribution of magnetic fields at positions of magnetoresistive sensor units in the Z-axis magnetoresistive sensor.

FIG. 7 is a third structural diagram of the Z-axis magnetoresistive sensor, where the Z-axis magnetoresistive sensor includes only 2 flux concentrators 65 and 66, magnetoresistive sensor unit columns 75 and 76 are respectively located at outer side positions or inner side positions of two Y-axis central lines corresponding to the 2 flux concentrators, and are equidistant from the Y-axis central lines of the respective flux concentrators. Apparently, in this case, the two positions also have X-direction magnetic-field components that are the same in magnitude and opposite in direction, thus forming a push-pull bridge structure. For ease of description, FIG. 7 only shows a situation where the two magnetoresistive sensor unit columns are both at the outer sides, and actually, a situation where the two magnetoresistive unit columns are both at the inner sides may also be included.

Figure 8:
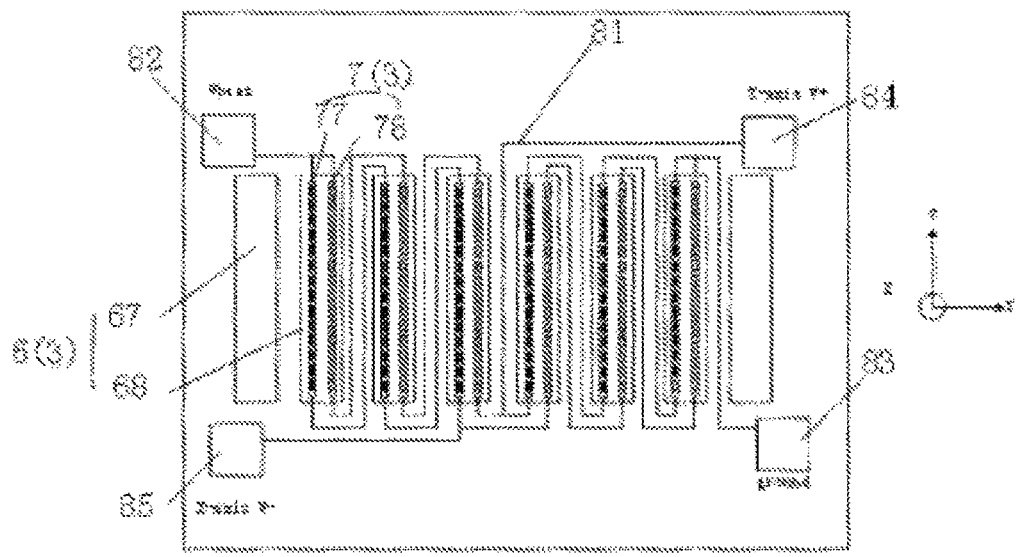
FIG. 8 is a diagram of electric connection of the magnetoresistive sensor units in the Z-axis magnetoresistive sensor.
Figure 9:
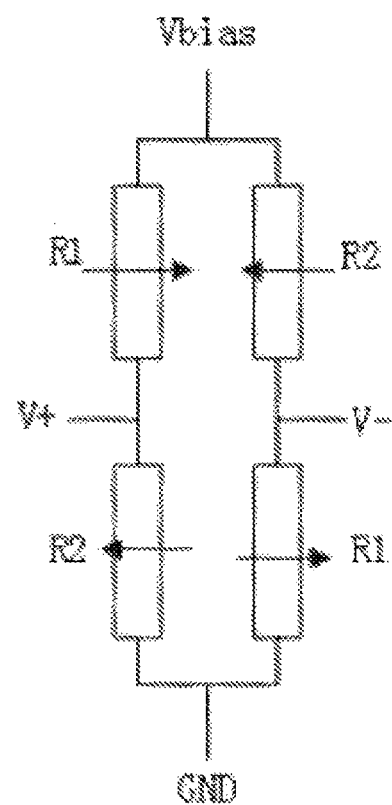
FIG. 9 is a schematic diagram of a full bridge of a push-pull magnetoresistive sensor.

FIG. 8 is a diagram of electric connection of the Z-axis magnetoresistive sensor. The magnetoresistive sensor units are electrically connected into a push-pull bridge structure, which at least includes one push arm and one pull arm, each of the push arm and the pull arm includes a two-port structure consisting of one or more electrically connected magnetoresistive sensor units, and the magnetoresistive units are arranged into multiple parallel magnetoresistive unit columns, where 81 represents a connecting wire, 82 and 83 represent a power input end and a grounding end respectively, 85 and 84 represent signal output ends respectively, and 6(3) represents flux concentrators, 67 being located at two sides and 68 being located in the middle; the magnetoresistive sensor unit columns 77 and 78 are respectively located at two sides of the Y-axis central line above or below the flux concentrator and are equidistant from the Y-axis central line, forming a part of the push arm and the pull arm, where the magnetoresistive units are arranged into magnetoresistive unit columns. In FIG. 8, a push-pull magnetoresistive bridge of a full bridge structure is shown, including 4 bridge arms, that is, two push arms and two pull arms, the push arms and the pull arms each including multiple magnetoresistive columns, and forming a two-port structure. The push-pull full bridge structure of the Z-axis magnetoresistive sensor is as shown in FIG. 9, where four bridge arms R1, R2, R3 and R4 forming the full bridge are adjacent pairwise, having a feature of opposite external magnetic field responses.

Figure 10:
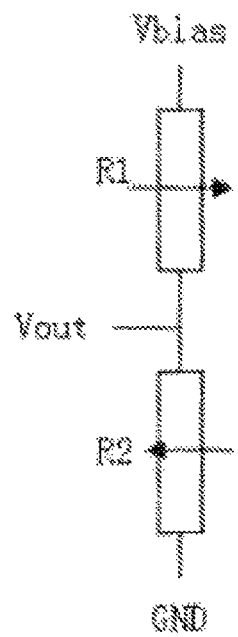
FIG. 10 is a schematic diagram of a half bridge of a push-pull magnetoresistive sensor.

FIG. 10 gives a push-pull full bridge structure, which actually further includes a push-pull structure of a half bridge type, including two arms R1 and R2, where one is a push arm, and the other is a pull arm. In addition, a quasi-bridge structure may further be formed.

Embodiment 4

Figure 11:
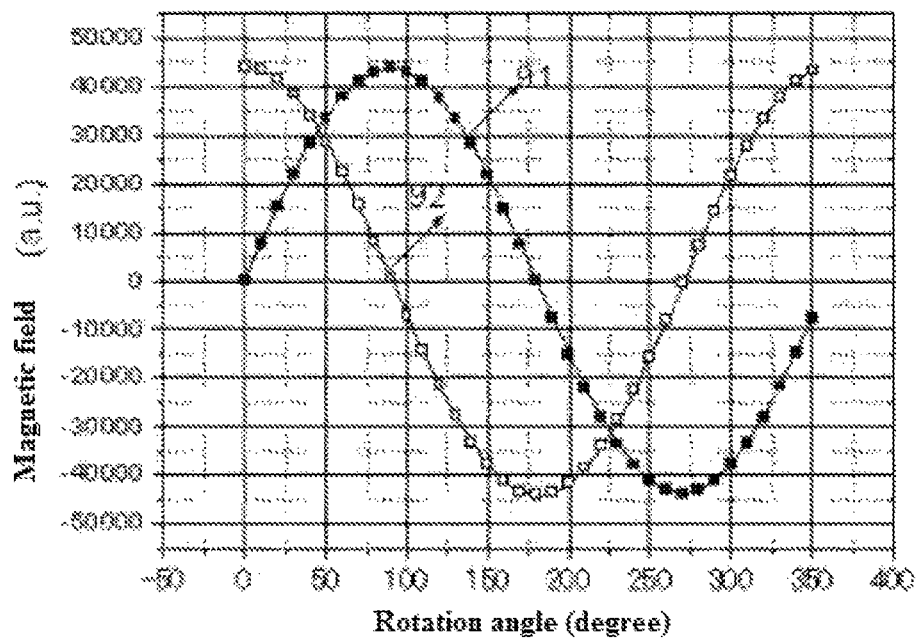
FIG. 11 is a diagram of a magnetic field measurement amplitude vs. rotation angle relation of the dual Z-axis magnetoresistive rotation angle sensor.

FIG. 11 shows sensitive magnetic fields H1 and H2 measured by the two Z-axis sensor chips when the circular permanent magnet encoding disc rotates around the central axis, an angle between the magnetization direction M of the circular permanent magnet encoding disc and the direction H1 is φ, and a rotation angle of the permanent magnet encoding disc may be defined by using φ; and a magnetic field measurement angle α between the magnetic-field components H1 and H2 respectively measured by the two Z-axis sensors is defined as follows:

$$\alpha = a\tan(Hy/Hx), Hx>0, Hy>0$$

$$= a\tan(Hy/Hx)+pi, Hx>0, Hy<0$$

$$= a\tan(Hy/Hx)-pi, Hx<0, Hy<0$$

In FIGS. 11, 91 and 92 are respectively relations of the sensitive magnetic fields H1 and H2 of the Z-axis magnetoresistive sensor chip 1 and the Z-axis magnetoresistive sensor 2 varying with the rotation angle φ of the circular permanent magnet encoding disc; it can be seen that, the varying of the magnetic fields H1 and H2 with the rotation angle is a sine/cosine varying relation, and a phase difference is 90 degrees.

Figure 12:
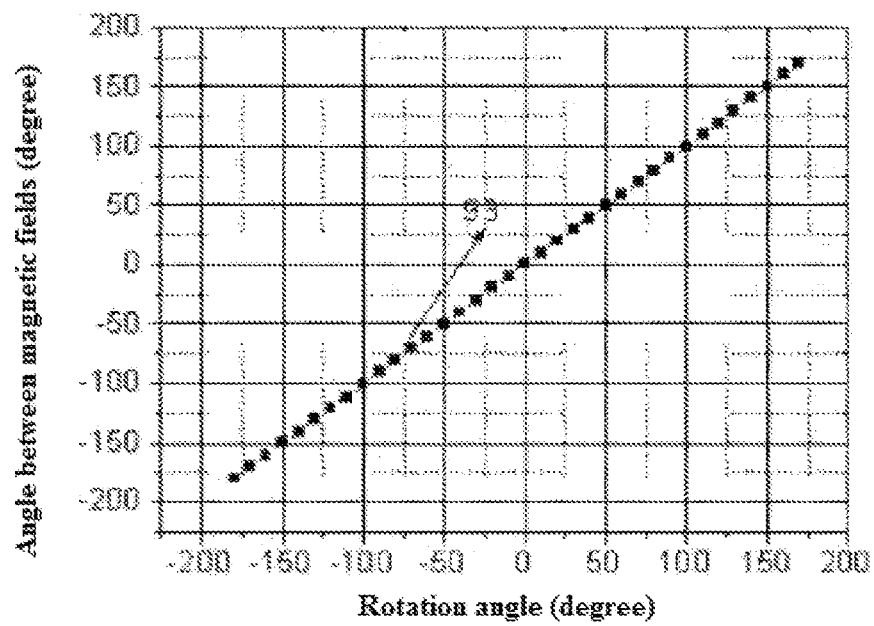
FIG. 12 is a diagram of a magnetic field measurement angle vs. rotation angle relation of the dual Z-axis magnetoresistive rotation angle sensor.

In FIG. 12, 93 is a typical relation curve 93 between the magnetic field measurement angle α and the rotation angle φ of the circular permanent magnet encoding disc; it can be seen that, the curve 93 has a straight line feature, indicating that there is a linear relation between the magnetic field measurement angle and the rotation angle, and the rotation angle of the circular permanent magnet encoding disc can be measured by using output signals of the two Z-axis magnetoresistive sensor chips.

Figure 13:
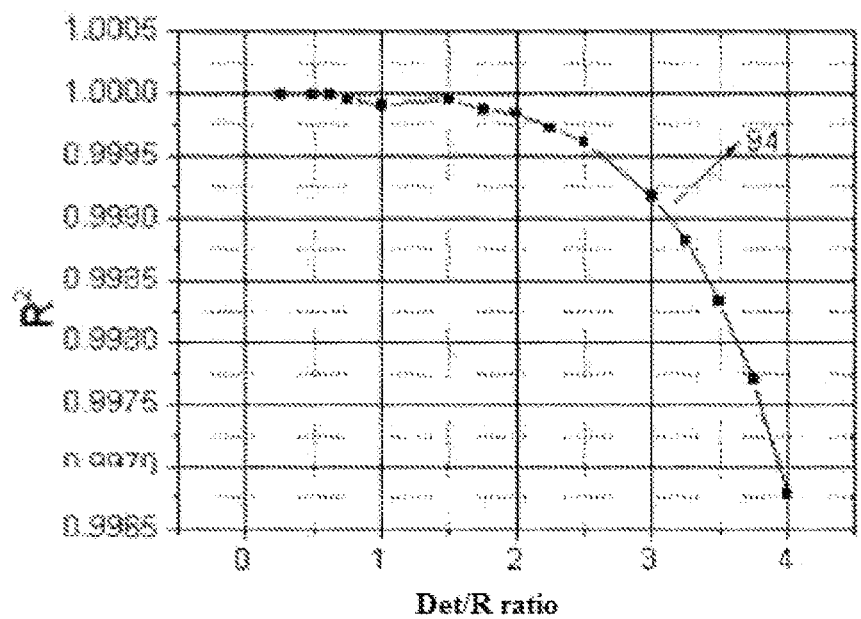
FIG. 13 is a diagram of a relation between a linear fitting parameter R2 of a magnetic field measurement angle vs. rotation angle relation curve of the dual Z-axis magnetoresistive rotation angle sensor and a Det/R ratio.

FIG. 13 is a relation curve 94 between a fitting parameter R2 and a Det/R ratio during linear fitting of a magnetic field measurement angle α vs. circular permanent magnet rotation angle φ curve that is obtained when the Z-axis magnetoresistive sensor chips 1 and 2 are at different distances Det from the circular permanent magnet encoding disc 3. It can be seen that, as Det/R increases, R2 starts to be stable around 1.0, and then gradually decreased upon reaching 2.0. Generally, R2 is highly linear, and is maintained above 0.997. To enhance the measurement precision of the angle, the circular permanent magnet encoding disc is rotated by 0-2 r, where r is the radius of the circular permanent magnet encoding disc. Therefore, it can be seen that, the dual Z-axis magnetoresistive angle sensor has a working space much larger than a space of the X-Y axis, which is smaller than an r region, and therefore is more flexible.

The invention claimed is:

1. A dual Z-axis magnetoresistive angle sensor, comprising:
   a circular permanent magnet encoding disc,
   two Z-axis magnetoresistive sensor chips, and
   a PCB,
   wherein the circular permanent magnet encoding disc is attached to a rotating shaft, wherein the rotating shaft is configured to rotate around a central axis of the circular permanent magnet encoding disc, and the circular permanent magnet encoding disc has a rotation plane perpendicular to the central axis, wherein the rotation plane extends through the circular permanent magnet;
   wherein the two Z-axis magnetoresistive sensor chips each comprise a substrate and at least one Z-axis magnetoresistive sensor located on the substrate, and a magnetic field sensitive direction of the Z-axis magnetoresistive sensor is perpendicular to a plane where the substrate is located;
   wherein the two Z-axis magnetoresistive sensor chips are on the PCB and are in the rotation plane outside of a periphery of the circular permanent magnet, magnetic field sensitive directions of the two Z-axis magnetoresistive sensor chips as well as the central axis of the circular permanent magnet encoding disc are orthogonal to one another, the two Z-axis magnetoresistive sensor chips having angular positions with respect to the central axis orthogonal to each other and the two Z-axis magnetoresistive sensor chips maintain an equal distance from the central axis of the circular permanent magnet encoding disc;
   wherein the two Z-axis magnetoresistive sensor chips are positioned operably close to the circular permanent magnet encoding disc so that, when the circular permanent magnet encoding disc rotates, the two Z-axis magnetoresistive sensor chips separately convert two orthogonal magnetic field signals generated by the circular permanent magnet encoding disc into two voltage signals for output, thereby calculating, according to the two voltage signals, a rotation angle ranging from 0-360 degrees of the circular permanent magnet encoding disc.

2. The dual Z-axis magnetoresistive angle sensor according to claim 1, wherein a magnetization direction of the circular permanent magnet encoding disc is parallel to the diameter direction.

3. The dual Z-axis magnetoresistive angle sensor according to claim 1, wherein the equal distance maintained by the two Z-axis magnetoresistive sensor chips from the central axis of the circular permanent magnet encoding disc is less than twice a radius of the circular permanent magnet encoding disc.

4. A dual Z-axis magnetoresistive angle sensor, comprising:
   a circular permanent magnet encoding disc,
   two Z-axis magnetoresistive sensor chips, and
   a PCB,
   wherein the circular permanent magnet encoding disc is attached to a rotating shaft, wherein the rotating shaft is configured to rotate around a central axis of the circular permanent magnet encoding disc, and the circular permanent magnet encoding disc has a rotation plane perpendicular to the central axis, wherein the rotation plane extends through the circular permanent magnet;
   wherein the two Z-axis magnetoresistive sensor chips each comprise a substrate and at least one Z-axis magnetoresistive sensor located on the substrate, and a magnetic field sensitive direction of the Z-axis magnetoresistive sensor is perpendicular to a plane where the substrate is located;
   wherein the two Z-axis magnetoresistive sensor chips are on the PCB and are in the rotation plane outside of a periphery of the circular permanent magnet, magnetic field sensitive directions of the two Z-axis magnetoresistive sensor chips as well as the central axis of the circular permanent magnet encoding disc are orthogonal to one another, and the two Z-axis magnetoresistive sensor chips maintain an equal distance from the central axis of the circular permanent magnet encoding disc;
   wherein the two Z-axis magnetoresistive sensor chips are positioned operably close to the circular permanent magnet encoding disc so that, when the circular permanent magnet encoding disc rotates, the two Z-axis magnetoresistive sensor chips separately convert two orthogonal magnetic field signals generated by the circular permanent magnet encoding disc into two voltage signals for output, thereby calculating, according to the two voltage signals, a rotation angle ranging from 0-360 degrees of the circular permanent magnet encoding disc, wherein the Z-axis magnetoresistive sensor comprises magnetoresistive sensor units and a flux concentrator, the flux concentrator is elongated with a major axis parallel to a Y-axis direction and a minor axis parallel to an X-axis direction, the magnetoresistive sensor units have sensitive directions parallel to the X axis direction, and are electrically connected into a magnetoresistive bridge comprising at least two bridge arms, wherein each of the bridge arms is a two-port structure formed by electrically connecting one or more magnetoresistive sensor units, the magnetoresistive sensor units in the bridge arms are arranged into multiple magnetoresistive columns along a direction parallel to the Y-axis direction, and the magnetoresistive bridge is a push-pull bridge, the push arm and the pull arm being respectively located at different sides of a Y-axis central line above or below the flux concentrator and being equidistant from the corresponding Y-axis central line.

5. The dual Z-axis magnetoresistive angle sensor according to claim 4, wherein the flux concentrator is a soft magnetic alloy material comprising one or more elements of Ni, Fe, Co.

6. The dual Z-axis magnetoresistive angle sensor according to claim 4, wherein the magnetoresistive sensor unit is a GMR or TMR magnetoresistive sensor unit.

7. The dual Z-axis magnetoresistive angle sensor according to claim 4, wherein the Z-axis magnetoresistive sensor comprises N+2 flux concentrators, and the magnetoresistive columns correspond to N flux concentrators in the middle, N being an integer greater than 0.

8. The dual Z-axis magnetoresistive angle sensor according to claim 4, wherein the Z-axis magnetoresistive sensor comprises one flux concentrator, and the magnetoresistive columns correspond to the one flux concentrator.

9. The dual Z-axis magnetoresistive angle sensor according to claim 4, wherein the Z-axis magnetoresistive sensor comprises 2 flux concentrators, and the magnetoresistive columns respectively correspond to positions at different sides of Y-axis central lines of the 2 flux concentrators, and are equidistant from the Y-axis central lines of the corresponding flux concentrators.

10. The dual Z-axis magnetoresistive angle sensor according to claim 4, wherein a space S between two adjacent flux concentrators in the Z-axis magnetoresistive sensor is not less than a width Lx of the flux concentrator.

11. The dual Z-axis magnetoresistive angle sensor according to claim 4, wherein a space S between two adjacent flux concentrators in the Z-axis magnetoresistive sensor is greater than 2Lx, Lx being a width of the flux concentrator.

12. The dual Z-axis magnetoresistive angle sensor according to claim 4, wherein as a space between the magnetoresistive unit columns of the Z-axis magnetoresistive sensor and an upper edge or a lower edge of the flux concentrator decreases, or a thickness Lz of the flux concentrator increases, or a width Lx of the flux concentrator decreases, sensitivity of the z-axis magnetoresistive sensor increases.

13. The dual Z-axis magnetoresistive angle sensor according to claim 1, wherein the Z-axis magnetoresistive sensor comprises magnetoresistive sensor units electrically connected into a push-pull bridge, and the push-pull bridge of the Z-axis magnetoresistive sensor is one of a half bridge structure, a full bridge structure, or a quasi-bridge structure.

14. The dual Z-axis magnetoresistive angle sensor according to claim 1, wherein the two Z-axis magnetoresistive sensors have the same magnetic field sensitivity.

* * * * *

UNITED STATES PATENT AND TRADEMARK OFFICE
CERTIFICATE OF CORRECTION

PATENT NO. : 10,690,515 B2  
APPLICATION NO. : 15/504981  
DATED : June 23, 2020  
INVENTOR(S) : Deak et al.

Page 1 of 1

It is certified that error appears in the above-identified patent and that said Letters Patent is hereby corrected as shown below:

On the Title Page

In item (73), in "Assignee", in Column 1, Line 1, delete "Co." and insert --Co.,-- therefor In the Claims In Column 7, Line 57, in Claim 1, delete "other" and insert --other,-- therefor In Column 9, Line 9, in Claim 5, before "Co.", insert --and--

Signed and Sealed this  
Fifth Day of January, 2021

Andrei Iancu  
*Director of the United States Patent and Trademark Office*